United States Patent [19]

Nakano et al.

[11] Patent Number: 4,985,868
[45] Date of Patent: Jan. 15, 1991

[54] DYNAMIC RANDOM ACCESS MEMORY HAVING IMPROVED REFRESH TIMING

[75] Inventors: Tomio Nakano, Kawasaki; Hidenori Nomura, Yokohama, both of Japan

[73] Assignees: Fujitsu Limited, Kawasaki; Fujitsu VLSI Limited, Kasugai, both of Japan

[21] Appl. No.: 449,427

[22] Filed: Dec. 14, 1989

Related U.S. Application Data

[63] Continuation of Ser. No. 89,460, Aug. 26, 1987, abandoned.

[30] Foreign Application Priority Data

Aug. 27, 1986 [JP] Japan .................. 61-198938

[51] Int. Cl.⁵ .............................. G11L 7/00
[52] U.S. Cl. .............................. 365/222; 365/230.08; 365/233; 365/193
[58] Field of Search .............. 365/222, 233, 193, 194, 365/230.08; 307/475

[56] References Cited

U.S. PATENT DOCUMENTS

| | | | |
|---|---|---|---|
| 4,334,295 | 6/1982 | Nagami | 365/222 |
| 4,472,647 | 9/1984 | Allgood et al. | 307/475 |
| 4,672,243 | 6/1987 | Kirsch | 307/475 |
| 4,682,052 | 7/1987 | Kyomasu | 307/475 X |
| 4,747,082 | 5/1988 | Minato et al. | 365/222 |
| 4,758,992 | 7/1988 | Taguchi | 365/201 X |

FOREIGN PATENT DOCUMENTS

| | | |
|---|---|---|
| 0081381 | 6/1983 | European Pat. Off. . |
| 0109069 | 5/1984 | European Pat. Off. . |
| 0145582 | 6/1985 | European Pat. Off. . |
| 0153469 | 9/1985 | European Pat. Off. . |
| 3305501 | 9/1983 | Fed. Rep. of Germany . |
| 0159293 | 9/1983 | Japan ................. 365/222 |
| 2024474 | 1/1980 | United Kingdom ............ 365/222 |
| 2116338 | 9/1983 | United Kingdom ............ 365/222 |

OTHER PUBLICATIONS

Soviet Invetions Illustrated, Section E1, Week 8341, Nov. 23, 1983, Su-982 089.

*Primary Examiner*—Stuart N. Hecker
*Assistant Examiner*—Andrew L. Sniezek
*Attorney, Agent, or Firm*—Armstrong, Nikaido, Marmelstein, Kubovcik & Murray

[57] ABSTRACT

A dynamic random access memory including: a memory constituted by a plurality of dynamic type memory cells; a refresh control circuit for refreshing the memory cells by controlling a refresh address circuit in a refresh mode; an address latch circuit for latching an external address signal in a read/write mode and latching a refresh address signal in the refresh mode; a clock generating circuit for generating a second clock and a third clock based on a first clock obtained after a predetermined delay time from a trailing edge of a row address strobe signal, the second clock controlling a first timing for taking the external address signal into the address latch circuit in the read/write mode, and the third clock is generated after the second clock and controls a second timing for taking the refresh address signal into the address latch circuit in the refresh mode.

7 Claims, 10 Drawing Sheets

Fig. 15

DYNAMIC RANDOM ACCESS MEMORY HAVING IMPROVED REFRESH TIMING

This application is a continuation of application Ser. No. 089,460 filed Aug. 26, 1987, now abandoned.

BACKGROUND OF THE INVENTION

1. Field of the Invention

The present invention relates to a semiconductor memory device, and more particularly, to a dynamic random access memory (DRAM) having an improved refresh timing.

2. Description of the Related Art

In the DRAM, the data is stored in a capacitor of a memory cell on the basis of whether or not there is a charge in the capacitor. Accordingly, the data must be refreshed to hold it in the capacitor, since the data will be lost with the lapse of time, due to a leakage of current from the capacitor.

Therefore, the DRAM is set to two modes, i.e., a read/write mode for reading or writing the data, and a refresh mode for refresh the data. In this case, although the operation speed of the DRAM depends on the read/write and the refresh operation speed at those modes, particularly, the timing of the refresh mode becomes an important factor for a high speed operation of the DRAM.

Consequently, the timing of the refresh mode must be improved to achieve a high speed operation of the DRAM.

SUMMARY OF THE INVENTION

The object of the present invention is to provide a dynamic random access memory having an improved refresh timing.

In accordance with the present invention, there is provided a DRAM including: a memory constituted by a plurality of dynamic type memory cells; a refresh control circuit for refreshing the memory cells by controlling a refresh address circuit in a refresh mode;

An explanation will be given of a conventional read/write and refresh timing in the DRAM.

Figure 1:
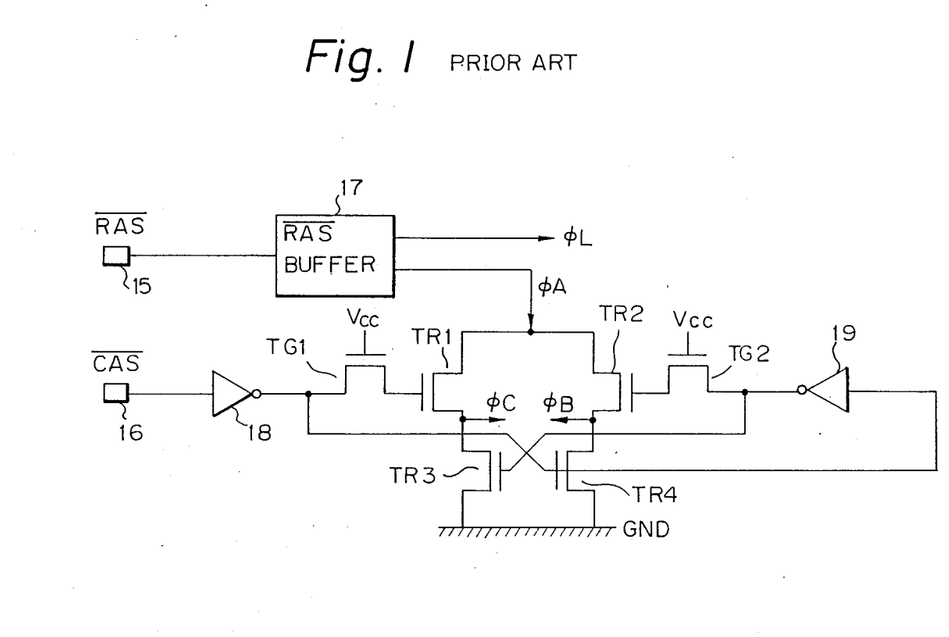
FIG. 1 is a principal circuit diagram of a conventional clock generator.

In FIG. 1, $\overline{RAS}$ denotes a row address strobe signal, $\overline{CAS}$ a column address strobe signal, and $\phi A$, $\phi B$, $\phi C$ and $\phi L$ internal clock signals. TG1 and TG2 denote gate transistors, and TR1 to TR4 transistors. Further, reference numbers 15 and 16 denote input terminals, 17 a $\overline{RAS}$ buffer, and 18 and 19 inverters. $V_{CC}$ denotes a first power source, GND a second power source, i.e., ground.

The signals $\overline{RAS}$ and $\overline{CAS}$ are input from an external circuit of the DRAM to the input terminals 15 and 16 for setting the read/write mode and the refresh mode. The clocks $\phi A$ and $\phi L$ are generated from the $\overline{RAS}$ buffer 17 after the predetermined delay time. In this case, the delay time of the clock $\phi A$ is different from that of the clock $\phi L$ as explained below. The clock $\phi B$ is obtained from a common node of the transistors TR2 and TR4, and the clock $\phi C$ is obtained from a common node of the transistors TR1 and TR3. That is, when the transistor TR2 is ON and the transistor TR4 is OFF, the clock $\phi B$ becomes high level. When the transistor TR1 is ON and the transistor TR3 is OFF, the clock $\phi C$ becomes high level as explained below.

Figure 2:
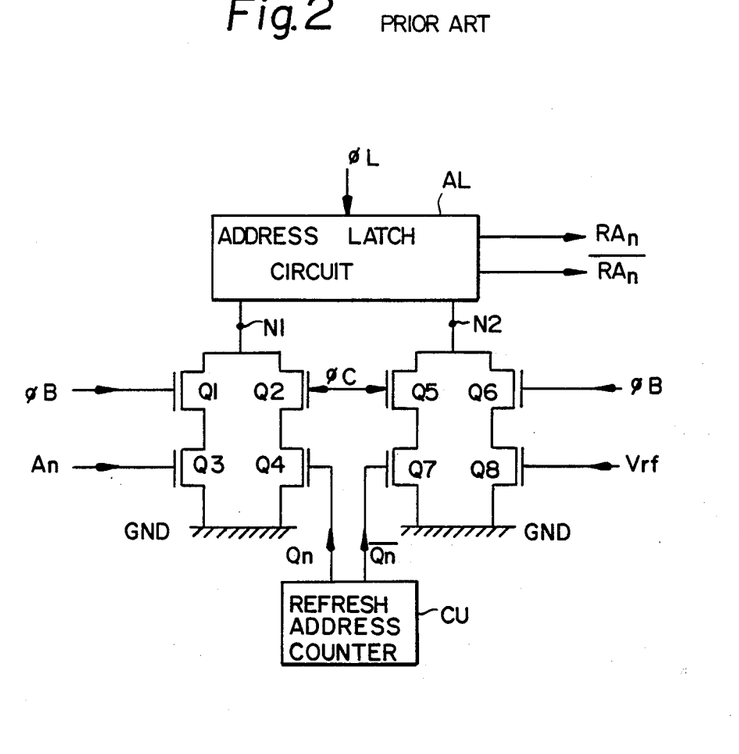
FIG. 2 is a principal circuit diagram of a conventional address latch circuit and peripheral circuits.

In FIG. 2, AL denotes an address latch circuit constituted by, for example, flip-flop circuits, and CU a refresh address counter. N1 denotes a first input connection point (first node), and N2 a second input connection point (second node). Q1 to Q8 denote transistors constituting a peripheral circuit. $A_n$ denotes an input address signal (TTL level) from an external stage (not shown), $Q_n$ a refresh address signal from the refresh address counter CU, $\overline{Q_n}$ a complementary refresh address signal of the signal $Q_n$, $RA_n$ a latched address signal (MOS level) from the address latch circuit AL, $\overline{RA_n}$ a complementary latched address signal (MOS level) of the signal $RA_n$, and $V_{rf}$ a reference voltage level (approximately, 1.5 volts) generated from the internal circuit (not shown). The clocks $\phi B$, $\phi C$ and $\phi L$ are input from the clock generator shown in FIG. I. In this case, the clock $\phi L$ is used for activating the address latch circuit AL, the clock $\phi B$ for controlling the input address signal AN, and the clock $\phi C$ for controlling the refresh address signals $Q_n$ and $\overline{Q_n}$.

In the read/write mode, the charge of the node N1 is discharged in correspondence with the data of the external address signal $A_n$ through the transistors Q1 and Q3 when the clock $\phi B$ is high. The charge of the node N2 is discharged through the transistors Q6 and Q8. In this case, since the reference voltage $V_{rf}$ is set to the intermediate level of an amplitude of the input address signal $A_n$, the discharge quantity of the node N2 is different from that of the node N1. As a result, the external address signal $A_n$ can be taken into the address latch circuit AL.

In the refresh mode, the charge of the node N1 is discharged in correspondence with the signal $Q_n$ from the refresh counter CU through the transistors Q2 and Q4 when the clock C is high. The charge of the node N2 is discharged in correspondence with the signal $\overline{Q_n}$ from the refresh counter CU through the transistors Q5 and Q7.

Figure 3:
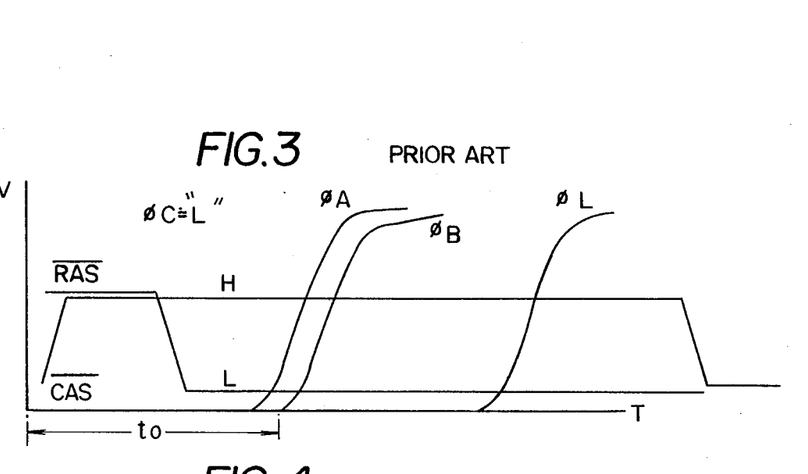
FIG. 3 is a timing chart of each clock in a read/write mode in FIG. 1.
Figure 4:
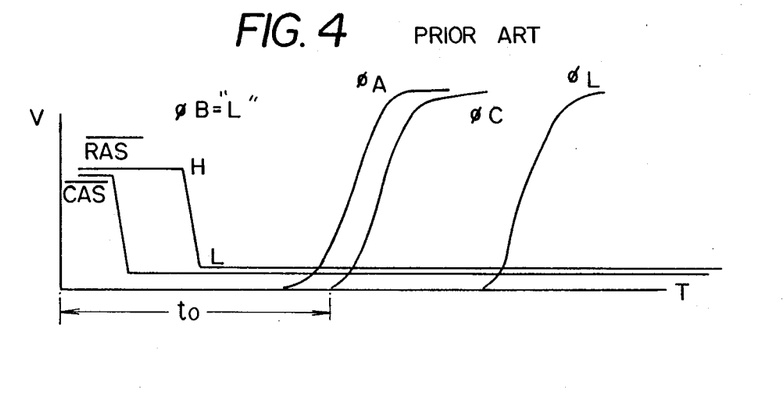
FIG. 4 is a timing chart of each clock in a refresh mode in FIG. 1.

In FIGS. 3 and 4, the ordinate V denotes voltages, and the abscissa t denotes time. The clock A is obtained from the $\overline{RAS}$ buffer 17 and this clock is delayed by the predetermined delay time from the trailing edge of the signal $\overline{RAS}$.

Figure 5:
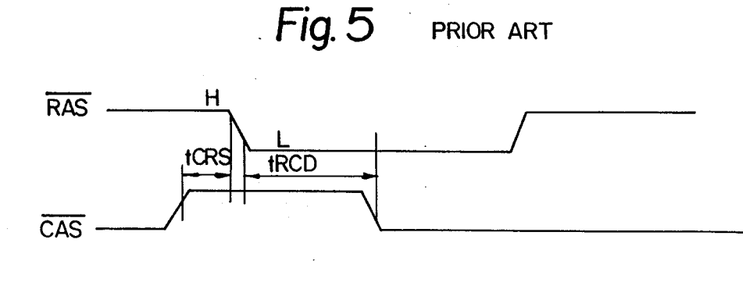
FIG. 5 is a chart for explaining a timing of row and column address strobe signals in the read/write mode.

In FIGS. 5, this timing chart denotes the read/write mode, hereinafter called the "normal cycle", $t_{CRS}$ denotes a set-up time of the signal $\overline{CAS}$ to signal $\overline{RAS}$, and $t_{RCD}$ is a delay time between the signal $\overline{RAS}$ and the signal $\overline{CAS}$.

Figure 6:
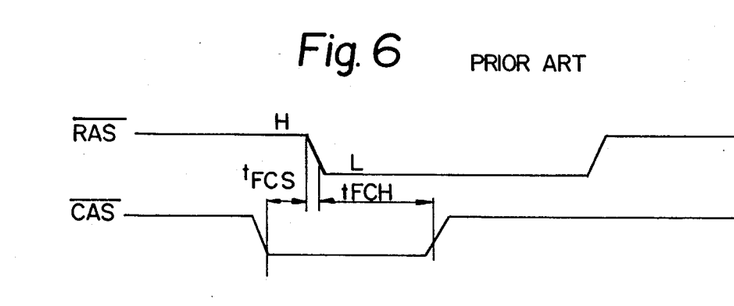
FIG. 6 is a chart for explaining a timing of row and column address strobe signals in the refresh mode.

In FIG. 6, this timing chart denotes the refresh mode, hereinafter the "CBR refresh cycle". The CBR means that the signal $\overline{CAS}$ is dropped from a high level to a low level before the signal $\overline{RAS}$ has dropped from a high level to a low level, $t_{FCS}$ denotes a set-up time of the signal $\overline{CAS}$ to the signal $\overline{RAS}$ for the refresh operation, and $t_{FCH}$ denotes a hold time of the signal $\overline{CAS}$ from the signal $\overline{RAS}$ for the refresh operation.

In the normal cycle, the row address strobe signal $\overline{RAS}$ is changed from high level (H) to low level (L) when the row address signal is taken from the external stage. At this timing, the column address strobe signal $\overline{CAS}$ is held to the high level. In the CBR refresh cycle, the signal $\overline{CAS}$ is changed from high level to low level before the signal $\overline{RAS}$ is changed from high level to low level. This trailing timing of the signal $\overline{CAS}$ is detected in the clock generator shown in FIG. 1 and the generated clock $\phi C$ is input to the transistors Q2 and Q5 shown in FIG. 2.

The operations of the conventional normal cycle and the CBR refresh cycle are explained in detail hereinafter.

In FIG. 3, the clock $\phi A$ rises from low level to high level after the predetermined delay time from the trailing edge of the signal $\overline{RAS}$. The clock $\phi A$ is input to the transistors TR1 and TR2 shown in FIG. 1.

In the normal cycle, since the signals $\overline{CAS}$ is high, the output of the inverter 18 is low so that the transistor TR4 is turned OFF, and since the output of the inverter 19 is high, the transistor TR3 is turned ON. Further, the transistor TR1 is turned OFF and the transistor TR2 is turned ON. Therefore, the clock $\phi B$ is high and the clock $\phi C$ is low. The clock $\phi B$ is input to the transistors Q1 and Q6 as shown in FIG. 2.

In FIG. 2, the address latch circuit AL is constituted by, for example, flip-flop circuits as explained above. Therefore, the transistors Q1 to Q8 are provided for forming current paths to discharge the charge in the flip-flop circuits. As shown in the drawing, the node N1 is connected to the ground GND through either the first current path consisting of the transistors Q1 and Q3, or the second current path consisting of the transistors Q2 and Q4. Further, the node N2 is connected to the ground GND through either the third current path consisting of the transistors Q5 and Q7, or the fourth current path consisting of the transistors Q6 and Q8.

When the clock $\phi B$ is input to the transistors Q1 and Q6, these transistors are turned ON. The transistor Q3 is turned ON or OFF in correspondence with high or low level of the input address signal $A_n$. In this case, when the transistor Q3 is turned ON, the charge of the node N1 is completely discharged to the ground GND. Since the reference voltage $V_{rf}$ is set to the intermediate level between the high level and the low level at the input address signal $A_n$, the transistor Q8 is not completely turned ON so that the discharge quantity from the node N2 is smaller than that of the node N1. Consequently, when the transistor Q3 is completely turned ON, the node N1 is discharged and becomes low level. When the transistor Q3 is completely turned OFF, the node N1 is held to the high level. In this timing, the node N2 is discharged and becomes low level since the transistor Q8 is turned ON at the intermediate state (i.e., incomplete turning ON state). As a result, the external address signal $A_n$ is latched in the address latch circuit AL and the data based on the latched address signal is output in correspondence with the clock $\phi L$ based on the row address signal $\overline{RA_n}$ or the complementary signal $RA_n$ from the circuit AL.

In the CBR refresh cycle, the clock $\phi C$ rises from low level to high level as shown in FIG. 4 That is, in FIG. 1, since the signal $\overline{CAS}$ is low, the output of the inverter 18 is high so that the transistor TR4 is turned ON. But, since the output of the inverter 19 is low, the transistor TR3 is turned OFF. Further, the transistor TR1 is turned ON and the transistor TR2 is turned OFF. Therefore, the clock $\phi C$ is high and the clock $\phi B$ is low.

In FIG. 2, the clock $\phi C$ is input to the transistors Q2 and Q5. Therefore, these transistors Q2 and Q5 are turned ON. The transistor Q4 is turned ON and the transistor Q7 is turned OFF when the refresh address signal $Q_n$ is high and the complementary refresh address signal $\overline{Q_n}$ is low. Further, the transistor Q7 is turned ON and the transistor Q4 is turned OFF when the signal $Q_n$ is low and the signal $\overline{Q_n}$ is high. The charge of the node N1 is discharged and becomes low level when the transistor Q4 is turned ON. The charge of the node N2 is discharged and becomes low level when the transistor Q7 is turned ON. Consequently, the refresh address signal from the counter CU is taken into the address latch circuit AL. The data based on the latched refresh address signal is output in correspondence with the clock $\phi L$ based on the row address signal $RA_n$ and the complementary signal $\overline{RA_n}$.

As shown in FIG. 6, it is necessary to drop the signal $\overline{CAS}$ from a high level to a low level before the signal $\overline{RAS}$ is dropped from a high level to a low level. Further, it is necessary to set this set-up time $t_{FCS}$ so that it is larger than the delay time caused by the inverters 18 and 19. In the normal cycle, it is necessary to raise the signal $\overline{CAS}$ from low level to high level before the signal $\overline{RAS}$ is dropped from high level to low level, as shown in FIG. 5. Approximately 10 to 20 (nano seconds) are necessary for this set-up time $t_{CRS}$.

As is well-known, the row address strobe signal $\overline{RAS}$ is the earliest clock, based on the system operation speed. However, in the CBR refresh cycle, the column address strobe signal $\overline{CAS}$ must be input before the signal $\overline{RAS}$ is input. Therefore, some problems arise regarding this early input timing of the signal $\overline{CAS}$. For example, it is not obvious whether or not the level of the $\overline{CAS}$ to be input is high in an initial state of a central processing unit (CPU). Therefore, a delay of approximately 50 (nano seconds) occurs for inputting the signal $\overline{CAS}$, since the signal $\overline{CAS}$ is input after determination by the CPU. Consequently, it is very difficult to achieve a high speed operation of the DRAM, because of these delay times for the set-up time.

SUMMARY OF THE INVENTION

The object of the present invention is to provide a dynamic random access memory having an improved refresh timing.

In accordance with the present invention, there is provided a DRAM including: a memory constituted by a plurality of dynamic type memory cells; a refresh control circuit for refreshing the memory cells by controlling a refresh address circuit in a refresh mode; an address latch circuit for latching an external address signal in a read/write mode and latching an internal refresh address signal in the refresh mode; a clock generating circuit for generating a second clock signal and a third clock signal based on a first clock signal obtained after a predetermined delay time from a trailing edge of a row address strobe signal, the second clock signal controlling a first timing for taking the external address signal into the address latch circuit in the read/write mode, and the third clock signal is generated after the second clock signal and controls a second timing for taking the refresh address signal into the address latch circuit in the refresh mode.

DESCRIPTION OF THE PREFERRED EMBODIMENTS

A dynamic random access memory having an improved refresh timing according to the present invention will be explained in detail hereinafter.

Figure 7:
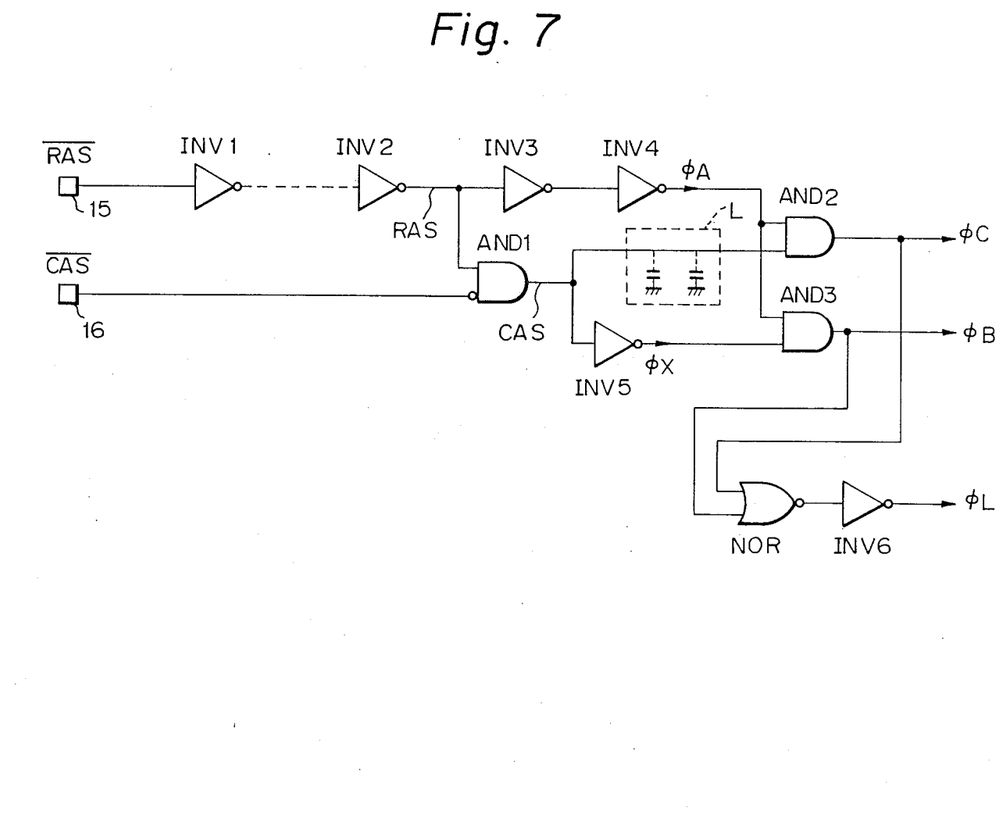
FIG. 7 is a principal circuit diagram of a clock generator according to an embodiment of the present invention.

In FIG. 7, INV 1 to INV 6 denote inverters. AND 1 to AND 3 denote AND gates. The signal $\overline{RAS}$ is delayed by a plurality of inverters INV 1 to INV 4 and the clock $\phi A$ is obtained from the inverter INV 4. The inverters INV 1 to INV 4 correspond to the $\overline{RAS}$ buffer 17 shown in FIG. 1. However, in the present invention, an inverted $\overline{RAS}$ signal (RAS) delayed by the inverters INV 1 to INV 2 is input to one input terminal of the gate AND 1. The signal $\overline{CAS}$ is inverted to an opposite level signal $\overline{CAS}$ in the other input terminal of the gate AND 1. Therefore, the signal $\overline{CAS}$ is obtained when the signal $\overline{CAS}$ is low. In this case, the signal $\overline{RAS}$ is always high. A$_n$ internal clock $\phi X$ is obtained by inverting the signal $\overline{CAS}$. Therefore, the clock $\phi C$ is obtained through the gate AND 2 when the clock $\phi A$ and the signal $\overline{CAS}$ are high. The clock $\phi B$ is obtained through the gate AND 3 when both clocks $\phi A$ and $\phi X$ are high. The clock $\phi L$ is obtained through the NOR gate and the inverter INV 6, except when both clocks $\phi B$ and $\phi C$ are low. Further, many loads, for example, capacitive loads of other clock generators, are shown by a dotted line L. The signal $\overline{CAS}$ is sent to these loads so that the leading edge of the signal $\overline{CAS}$ becomes a gentle slope, as shown by a dotted line in FIG. 10. The present invention utilizes this gentle slope of the signal $\overline{CAS}$. The operation of this circuit will be explained in detail hereinafter.

Figure 8:
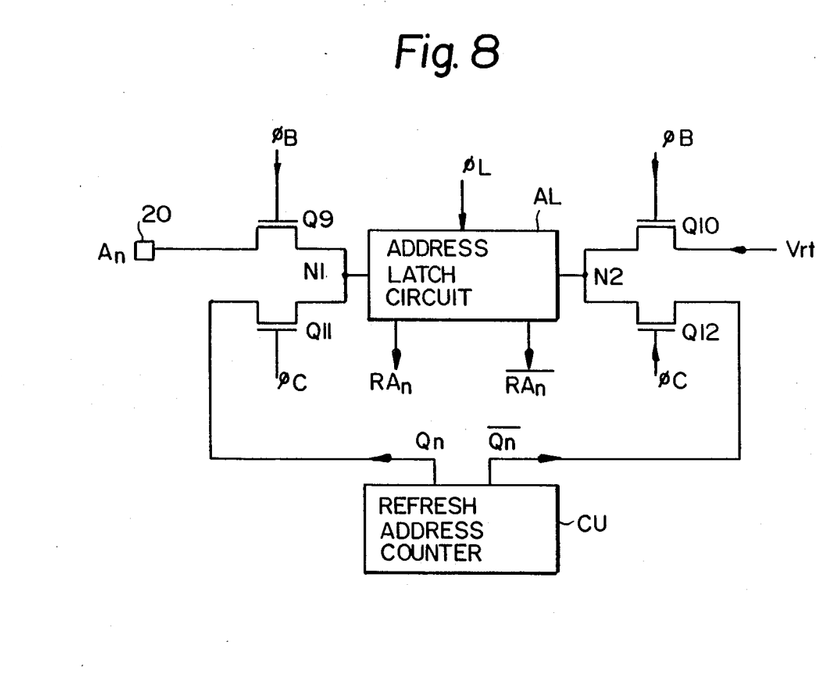
FIG. 8 is a principal circuit diagram of an address latch circuit and peripheral circuits according to an embodiment of the present invention.

In FIG. 8, Q9 to Q12 denote transistors. The external input address signal A$_n$ is input to an input terminal 20. As is obvious from the drawing, the signals A$_n$, $\overline{Q_n}$, A$_n$ and V$_{rf}$ are input to either the source or the drain side of each transistor. Conventionally, these signals are input to the gate side of each transistor as shown in FIG. 2. Therefore, each of transistors Q9 to Q12 is used only as a gate transistor. That is, the transistor Q9 is used for taking in the external address signal A$_n$ when the clock $\phi B$ is high in the normal cycle; the transistor Q10 is used for taking in the reference voltage V$_{rf}$ when the clock $\phi B$ is high in the normal cycle; the transistor Q11 is used for taking in the internal refresh address signal Q$_n$ when the clock $\phi C$ is high in the CBR refresh cycle; and the transistor Q12 is used for taking in the complementary refresh address signal $\overline{Q_n}$ the clock $\phi C$ is high in the CBR refresh cycle.

The operation of circuits shown in FIGS. 7 and 8 will be explained in detail with reference to FIGS. 9 and 10.

Figure 9:
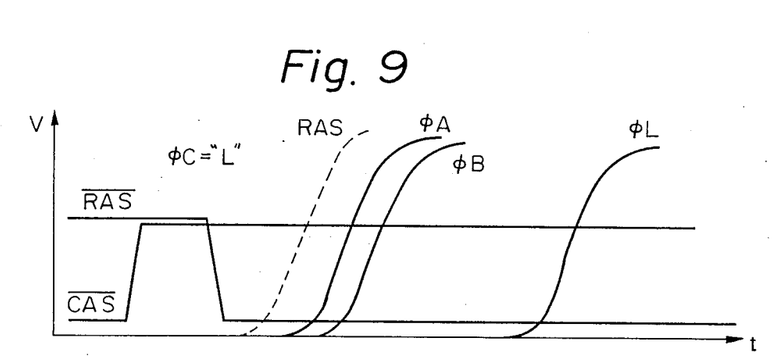
FIG. 9 is a timing chart of each clock in a read/write mode in FIG. 7.

In the normal cycle shown in FIG. 9, the clock $\phi B$ is generated from the gate AND 3 when both clocks A and $\phi X$ are high. That is, the signal $\overline{CAS}$ is high in the normal cycle, and the signal $\overline{CAS}$ generated from the gate AND 1 is low since the signal $\overline{RAS}$ is high. Therefore, the internal clock $\phi X$ is high so that the clock $\phi B$ is output from the gate AND 3, since the clock $\phi A$ is high. In this case, the clock $\phi C$ from the gate AND 2 is low, since the clock $\phi A$ is high and the signal $\overline{CAS}$ is low. Therefore, the clock $\phi L$ is output through the NOR gate and the inverter INV 6 when the clock $\phi B$ is high.

Figure 10:
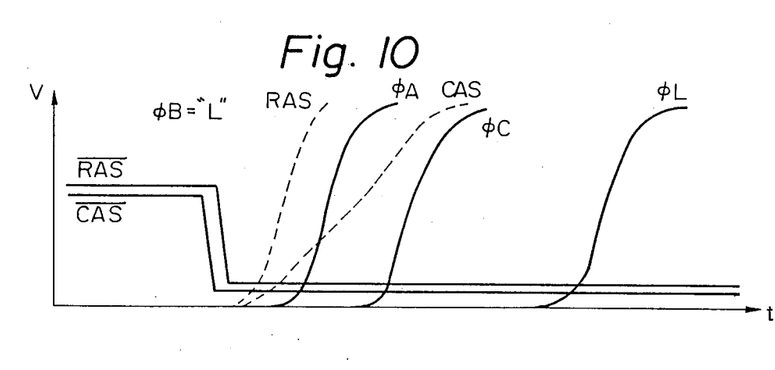
FIG. 10 is a timing chart of each clock in a refresh mode in FIG. 7.

In the CBR refresh cycle shown in FIG. 10, the clock $\phi C$ is generated from the gate AND 2 when the signal $\overline{CAS}$ and the clock $\phi A$ are high. That is, the signal $\overline{CAS}$ is low in the CBR refresh cycle, and the signal $\overline{CAS}$ is high since the signal $\overline{RAS}$ is high. In this case, the clock $\phi B$ is low, since the clock $\phi A$ is high and the clock $\phi X$ is low. Therefore, the clock $\phi L$ is output through the NOR gate and the inverter INV 6 when the clock $\phi C$ is high.

As shown by a dotted line in the drawing, the starting point of the leading edge of the signal $\overline{CAS}$ is earlier than that of the clock $\phi A$. However, the time at which it is completely raised is later than that of the clock $\phi A$. That is, the leading edge of the signal CAS becomes a gentle slope caused by many loads. Therefore, the time when the clock $\phi A$ and the signal CAS become high level is delayed so that the leading time of the clock $\phi C$ depends on the leading edge of the signal CAS. This is because, as explained above, many loads, for example, capacitive loads (see, FIG. 7), are provided to the output of the gate AND 1 for utilizing the signal CAS.

In the present invention, the difference of the leading time between the clock $\phi B$ and the clock $\phi C$ is utilized. That is, in the normal cycle shown in FIG. 9, the clock $\phi B$ immediately rises since the internal clock $\phi X$ is high because the signal CAS is low. But, in the CBR refresh cycle, the clock $\phi C$ rises after the signal CAS is completely raised for the above explained reason, although the clock $\phi A$ has already risen. Therefore, each of the gate transistors Q9 to Q12 shown in FIG. 8 is opened in correspondence with the input timing of these clocks $\phi B$ and $\phi C$ in the normal and the CBR refresh cycles.

In FIG. 8, when the clock $\phi B$ is input to the transistors Q9 and Q10 in the normal mode, these transistors are turned ON so that the external address signal A$_n$ is input to the address latch circuit AL through the node N1 and the reference voltage V$_{rf}$ is also input to the circuit AL through the node N2. The difference voltage between the signal A$_n$ and the reference voltage V$_{rf}$ is detected in the circuit AL and the row address signal RA$_n$ and the complementary row address signal $\overline{RA_n}$ are output from the circuit AL in correspondence with the clock $\phi L$ after this difference voltage is amplified. In this case, the clock $\phi L$ is generated at the same timing in the normal and CBR refresh cycles, to obtain a stable operation of the circuit AL in these cycles.

When the clock $\phi C$ is input to the transistors Q11 and Q12 in the CBR refresh cycle, these transistors are turned ON so that the refresh address signal Q$_n$ and the complementary refresh signal $\overline{Q_n}$ are input to the circuit AL through the nodes N1 and N2. As a result, the latched row address signal $RA_n$ and the complementary signal $\overline{RA_n}$ are output from the circuit AL.

In the present invention, it is possible to set the refresh set-up time $t_{FCS}$ (see, FIG. 6) so that it will become zero. That is, it is possible to set the same timing of the trailing edge between the signal $\overline{RAS}$ and the signal $\overline{CAS}$. Further, it is possible to set the later timing of the trailing edge of the CAS signal nearly simultaneous with or earlier than the signal $\overline{RAS}$ as depicted in FIG. 10. These are because the inverters 18 and 19 (see, FIG. 1) are not provided in the clock generator shown in FIG. 7 since the timing of the clock $\phi B$ is different from that of the clock $\phi C$. Consequently, it is possible to achieve a high speed operation of the system. As explained above, in the conventional clock generation shown in FIG. 1, the timing to of the clock $\phi B$ is the same as that of the clock $\phi C$, so that the inverters 18 and 19 are necessary. Therefore, it is necessary to set the refresh set-up time $t_{FCS}$ to a time sufficient to cover the delay time caused by these inverters 18 and 19 in the conventional clock generator.

Figure 11:
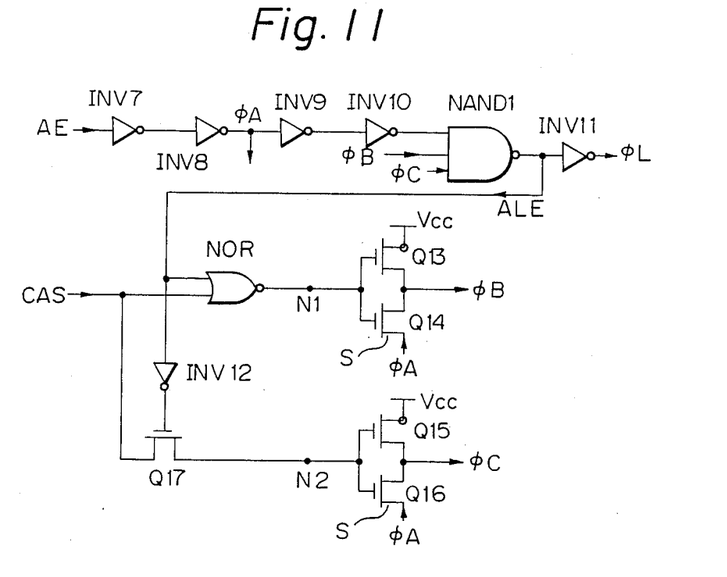
FIG. 11 is a principal circuit diagram of a clock generator according to another embodiment of the present invention.
Figure 12:
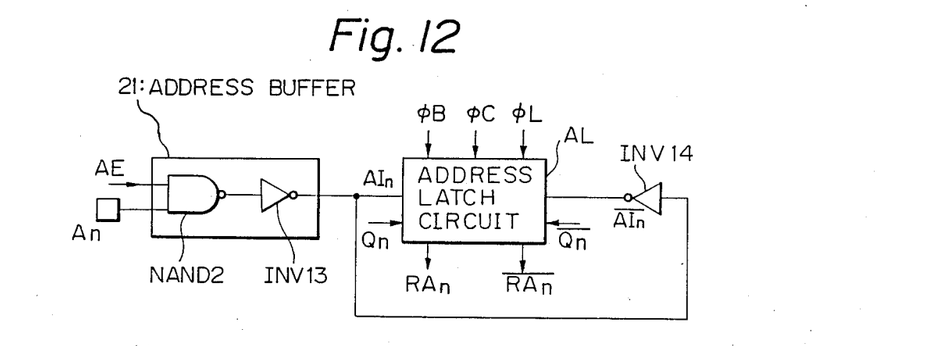
FIG. 12 is a principal circuit diagram of an address latch circuit according to another embodiment of the present invention.

In FIGS. 11 and 12, two CMOS (complementary metal oxide semiconductor) inverters are used in the clock generator, instead of the N-channel transistor used in the first embodiment shown in FIG. 8. In the case of a CMOS, the circuit can be operated by either a negative or a positive logic. But, in the case of the N-channel transistor, the circuit can be operated only by a positive logic. In general, the negative logic is better than the positive logic because the trailing operation of the signal is easier than the leading operation of the signal.

In FIG. 11, AE denotes a delay signal delayed from the signal $\overline{RAS}$, ALE a control signal for controlling generation of the clocks $\phi B$ and $\phi C$, Q13 and Q15 P-channel MOS transistors, and Q14 and Q16 N-channel MOS transistors. A pair of transistors Q13 and Q14 and a pair of transistors Q15 and Q16 constitute a CMOS inverter. The clock $\phi A$ is obtained from the signal AE after a delay by the inverters INV 7 and INV 8. This clock $\phi A$ is input to the source of the transistors Q14 and Q16. The clock $\phi B$ is obtained from a common node of the transistors Q13 and Q14, and the clock $\phi C$ is obtained from a common node of the transistors Q15 and Q16. The clocks $\phi B$ and $\phi C$ are input to the NAND gate, to achieve a quick operation of the NAND gate.

In FIG. 12, 21 denotes an address buffer comprising a NAND gate NAND 2 and an inverter INV 13. The address buffer 21 amplifies the external address signal $A_n$ having a TTL level voltage to a clock $\phi A$ having a MOS level voltage in correspondence with the timing of the signal AE. The clock $AI_n$ is input to the address latch circuit AL and the complementary clock $\overline{AI_n}$ inverted by the inverter INV 14 is also input to the address latch circuit AL.

The operations of these circuits shown in FIGS. 11 and 12 are explained in detail with reference to FIGS. 13 and 14.

Figure 13:
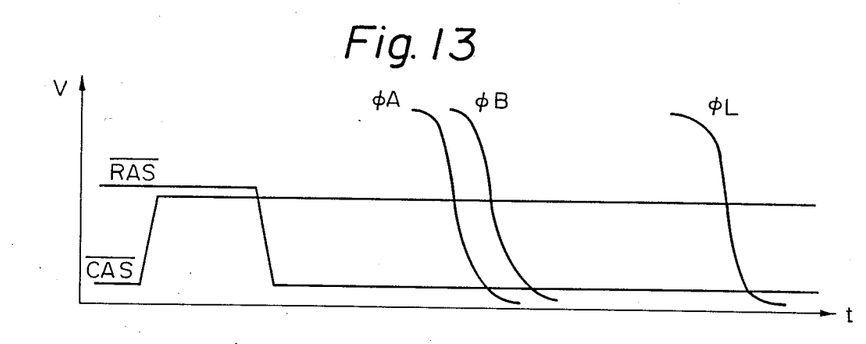
FIG. 13 is a timing chart of each clock in a read/write mode in FIG. 11.

In the normal cycle shown in FIG. 13, initially, the node N1 is high. When the signal AE is dropped from a high level to a low level, the clock $\phi A$ also drops from a high level to a low level after a delay by the two inverters INV7 and INV8. Therefore, the clock $\phi B$ becomes low level since the clock $\phi A$ is input to the source S of the transistor Q14. Further, when the signal ALE becomes high level after delay of the inverters INV9 and INV10 and the gate NAND1, the mode N1 becomes low level through the gate NOR and the clock $\phi B$ becomes high level (not shown). In the circuit shown in FIG. 11, since the clock $\phi B$ functions as "one shot pulse", only the curve from high level to low level is shown in FIG. 13.

Figure 14:
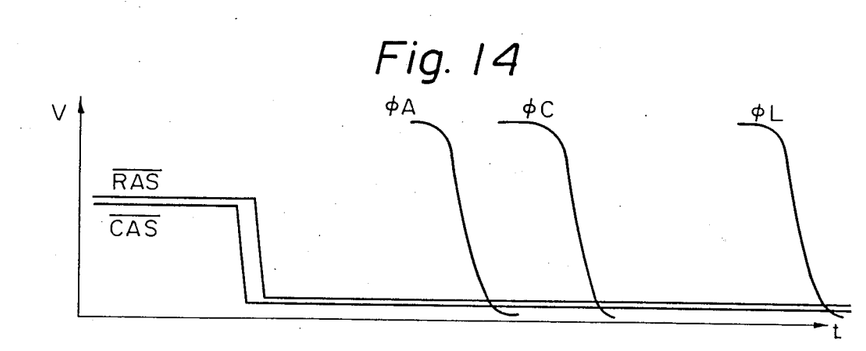
FIG. 14 is a timing chart of each clock in a refresh mode in FIG. 11.

In the CBR refresh cycle shown in FIG. 14, initially, the node N2 is low. However, since the signal $\overline{CAS}$ becomes high level before the signal AE becomes low level, the node N2 becomes high level and, then the node N1 becomes low level. Further, since the signal AE becomes low level, the clock $\phi A$ also becomes low level so that the clock $\phi C$ becomes low level through the source S of the transistor Q16. Further, since the signal ALE becomes high level, the node N2 becomes low level so that the clock $\phi C$ becomes high level (not shown). In the circuit shown in FIG. 11, since the clock $\phi C$ functions as "one shot pulse", only the curve from high level to low level is shown in FIG. 14.

As is obvious from the above, when the node N1 is high, the clock $\phi B$ is output, and when the node N2 is high, the clock $\phi C$ is output in correspondence with the timing of the clock $\phi A$. In this case, as explained above, the leading time of the signal $\overline{CAS}$ becomes a gentle slope, since many loads are connected for the signal CAS.

Figure 15:
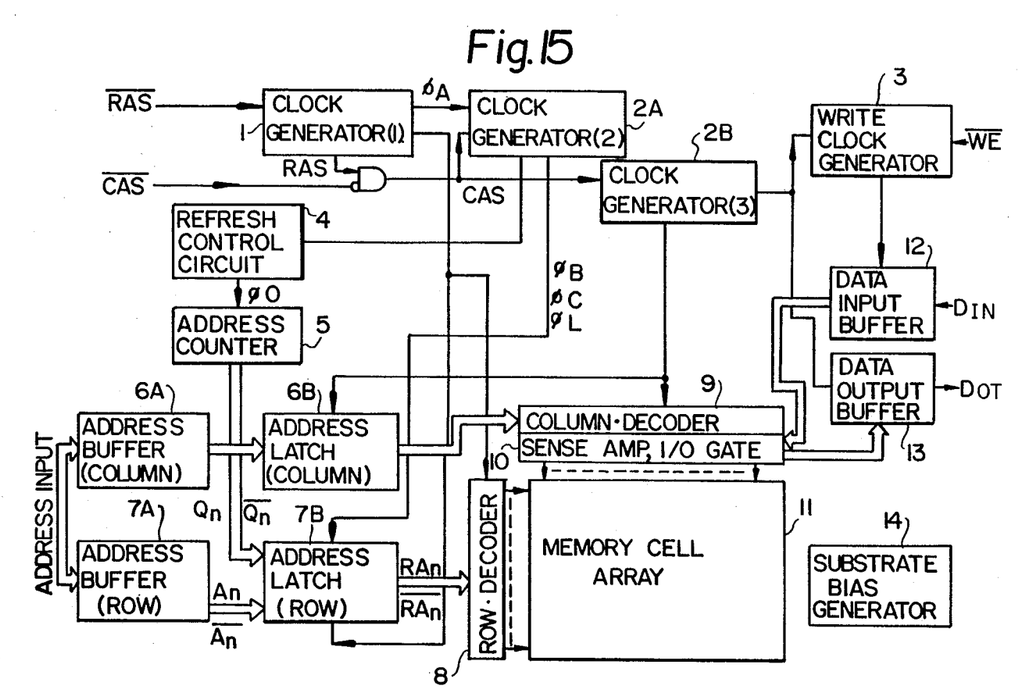
FIG. 15 is a schematic block diagram of the DRAM according to the present invention.

In FIG. 15, for example, MOS (metal oxide semiconductor) DRAM according to the present invention comprises: a first clock generator 1 for generating clocks, for example A, RAS, AE, etc.; a second clock generator 2A for generating clocks, for example, $\phi B$, $\phi C$, $\phi L$, ALE, etc. to activate a row address; a third clock generator 2B for generating clocks to control read/write operations for a column address; a write clock generator 3 for controlling a read/write mode based on an input write enable signal $\overline{WE}$; a refresh control circuit 4 for generating a clock $\phi O$ to control the operation of the internal refresh counter in the CBR refresh cycle; an address counter for generating an internal address signal for a refresh operation; an address buffer for a column side 6A and an address buffer for a row side 7A, each converting an input address level to an internal CMOS level; an address latch circuit for a column side 6B and an address latch circuit for a row side 7B, each latching an external address signal and a refresh address signal; a data input buffer 12 for converting the level of an input data $D_{IN}$ to an internal CMOS level; a data output buffer 13 for amplifying an output data $D_{OT}$; a substrate bias generator 14 for generating a back bias voltage; a memory cell array constituted by a plurality of DRAM cells; row and column decoders 8 and 9; and a sense amplifier - I/O gate 10.

We claim:
1. A dynamic random access memory comprising:
    a memory cell array constituted by a plurality of dynamic type memory cells;
    refresh address generating means for internally generating a refresh address signal;
    external address receiving means for receiving an external address signal;
    clock generating means for receiving a first external clock signal and a second external clock signal, for generating a first internal clock signal when said first external clock signal is input substantially earlier than said second external clock signal, and for generating a second internal clock signal when said second external clock signal is input nearly simultaneous with or earlier than the first external clock signal, a time interval from the input of said first external clock signal until the generation of said second internal clock signal being longer than a time interval from the input of said first external clock signal until the generation of said first internal clock signal; and address latch means, having a first and second input gates, for selectively latching either said external address signal through said first input gate or latch of said refresh address signal through said second input gate, and said first input gate being controlled by said first internal clock signal and said second input gate being controlled by said second internal clock signal, wherein latching of said refresh address signal to said address latch means at a refresh mode is performed in a timing later than the latching of said external address signal at a read/write mode.

2. A dynamic random access memory as claimed in claim 1, wherein said clock generating means comprises inverters for delaying said first external clock signal and for obtaining a complementary first external clock signal after a delay time of said inverters, two inverters for delaying said complementary first external clock signal and for obtaining a third internal clock signal after a delay time of said two inverters, a first AND gate for inputting said complementary first external clock signal and said second external clock signal and for obtaining a complementary second external clock signal, an inverter for inverting said complementary second external clock signal and for obtaining a fourth internal clock signal, a second AND gate for obtaining said second internal clock signal based on said third internal clock signal and said complementary second internal clock signal, and a third AND gate for obtaining said first internal clock signal based on said third internal clock signal and said fourth internal clock signal.

3. A dynamic random access memory as claimed in claim 2, wherein said clock generating means further comprises a NOR gate and an inverter for obtaining a fifth internal clock signal based on said first and second internal clock signals, said fifth internal clock signal for output timing of said address signals.

4. A dynamic random access memory as claimed in claim 1, wherein said clock generating means comprises two inverters for obtaining a third internal clock signal, a NAND gate for obtaining a control signal based on said first, second and third internal signals, a NOR gate for controlling a level of a first node based on said control signal and a complementary second external clock signal, a gate transistor for controlling a level of a second note based on a complementary control signal and said second external clock signal, a first CMOS inverter constituted by a pair of P and N-channel transistors and for obtaining said first internal clock signal based on said third internal clock signal input to a source of said N-channel transistor in said read/write mode, and a second CMOS inverter constituted by a pair of P and N-channel transistors and for obtaining said second internal clock signal based on said third internal clock signal input to a source of said N-channel transistor of said second inverter in said refresh mode.

5. A dynamic random access memory as claimed in claim 1, wherein said address latch means further comprises a first gate transistor turned ON by said first internal clock signal and for taking said external address signal into said address latch means in said read/write mode, a second gate transistor turned ON by said first internal clock signal and for taking a reference voltage into said address latch means in said read/write mode, a third gate transistor turned ON by said second internal clock signal and for taking said refresh address signal into said address latch means in said refresh mode, a fourth gate transistor turned ON by said second internal clock signal and for taking a complementary refresh address signal into said address latch means in said refresh mode, and a refresh address counter for generating said refresh address signal and said complementary refresh address signal based on control of a refresh control means in said refresh mode.

6. A dynamic random access memory as claimed in claim 1, wherein said address latch means further comprises an address buffer means constituted by a NAND gate and an inverter and for converting an input address signal voltage to a latched address signal voltage of said external address signal in correspondence with a delayed first external clock signal.

7. A dynamic random access memory as claimed in claim 4, wherein said clock generating means further comprises an inverter connected to an output of said NAND gate and for obtaining a fourth internal clock signal based on said control signal for outputting said address signals.

* * * * *